United States Patent [19]

Urala

[11] Patent Number: 4,805,236
[45] Date of Patent: Feb. 14, 1989

[54] METHOD AND ARRANGEMENT FOR INCREASING THE DYNAMIC RANGE AT AN INPUT STAGE OF AN OPTICAL RECEIVER

[75] Inventor: Reino Urala, Vantaa, Finland

[73] Assignee: Oy Nokia Ab, Helsinki, Finland

[21] Appl. No.: 941,430

[22] Filed: Dec. 15, 1986

[51] Int. Cl.⁴ .................................................. H04B 9/00
[52] U.S. Cl. .................................. 455/619; 250/214 X; 330/59
[58] Field of Search ............... 455/607, 608, 617, 619; 250/214 A, 214 AG, 214 L, 214 P; 330/59, 308

[56] References Cited

U.S. PATENT DOCUMENTS

| | | | |
|---|---|---|---|
| 3,611,173 | 10/1971 | Goulding | 330/59 |
| 3,968,361 | 7/1976 | Bungardner | 455/619 |
| 4,027,152 | 5/1977 | Brown et al. | 455/619 |
| 4,415,803 | 11/1983 | Muoi | 455/619 |
| 4,473,745 | 9/1984 | Chown | 455/619 |
| 4,498,197 | 2/1985 | Chown | 455/619 |
| 4,608,542 | 8/1986 | Siegel | 330/279 |

FOREIGN PATENT DOCUMENTS

| | | |
|---|---|---|
| WO86/01354 | 2/1986 | European Pat. Off. . |
| 53-133304 | 11/1978 | Japan ................................. 455/619 |
| 58-168343 | 10/1983 | Japan . |

OTHER PUBLICATIONS

Haas et al–Low Noise Optical Receiver–IBM Tech. Disclosure Bulletin–vol. 23 #8 Jan. 1981, p. 3845.

Primary Examiner—Robert L. Griffin
Assistant Examiner—Stephen Chin
Attorney, Agent, or Firm—Finnegan, Henderson, Farabow, Garrett & Dunner

[57] ABSTRACT

The invention relates to a method and arrangements for increasing the dynamic range at an input stage of an optical receiver, which input stage comprises a photodiode acting as a photodetector and an amplifying means the input of which is connected to one terminal of the photodiode. The input of the amplifier is connected to a diode attenuator the dynamic resistance of which is adjusted by means of a direct current proportional to the received optical level and substantially greater than the peak value of the detected signal current. At low levels of the optical signal the diode attenuator is brought into a high-impedance state.

3 Claims, 3 Drawing Sheets

$U = U_0 \ln(I/I_0 + 1)$ $r \approx U_0/I_1$ $U_0$ = constant $I_0$ = constant

METHOD AND ARRANGEMENT FOR INCREASING THE DYNAMIC RANGE AT AN INPUT STAGE OF AN OPTICAL RECEIVER

BACKGROUND OF THE INVENTION

The present invention relates to a method and arrangement for increasing the dynamic range at an input stage of a receiver in an optical fibre information transmission system.

An optical receiver is usually designed to be as sensitive as possible. The best results have been obtained by means of a high-impedance input stage. However, dynamic properties of such realizations are limited, and when strong optical signals are received the input stage is saturated and the detected signal is distorted. A kind of compromise solution is a transimpedance input stage. In commercially available PIN-FET modules, for instance, the sensitivities of the transimpedance input stages are even several decibels lower than those of high-impedance input stages; on the other hand, their dynamic range is larger.

Several special solutions have been developed for increasing the dynamic range. In U.S. Pat. Nos. 4,473,745 and 4,498,197, e.g., the problem has been tried to be solved by means of an RF-PIN diode which shunts part of the signal current generated by a photodiode o the earth when the received optical power is high. On the other hand, U.S. Pat. No. 4,540,952, for instance, utilizes for the same purpose a field effect transistor serving as an adjustable resistance.

The signal current generated by a photodiode includes both a dc component and an ac component, i.e. a proper signal component. If the signal is symmetric (an NRZ signal), the value $I_d$ of the dc component is in the same range as the peak value $I_p$ of the ac component, as illustrated in FIG. 1. In the U.S. Pat. Nos. 4,473,745 and 4,498,197, a detected dc component is applied directly to an RF-PIN diode attenuator as a control current, which is convenient, because the resistance of the RF-PIN diode is inversely proportional to the controlling current at high frequencies. As compared to the controlling dc component, the ac component, however, is so large that the diode functions within a non-linear range. Therefore it has been necessary in U.S. Pat. Nos. 4,473,745 and 4,498,197 to use an RF-PIN diode in which the carrier lifetime is so long that not even the lowest frequency components of the signal spectrum are distorted.

An insufficient carrier lifetime of RF-PIN diodes gives rise to problems at lower speeds, especially if signals having a poor balance or containing long "0" or "1" sequences are to be received. As a matter of fact, the control current of the attenuator disappears or is doubled with "0" and "1" sequences respectively. This results in heavy distortion of the signal.

The bandwidth of a high-impedance input stage of a receiver varies with the resistance of the attenuation diode. Therefore an adjustable RC equalizer has to be provided at a output of a amplifier of the input stage for compensating variation in the bandwidth. In U.S. Pat. No. 4,498,197, an RF-PIN diode is utilized in the equalizer as a varying resistance, and the RF-PIN diode is adjusted by means of the same control current as the attenuation diode. The resistance of these two RF-PIN diodes is thereby always the same. However, it is necessary for maintaining a proper signal-to-noise ratio, with low transmission speeds in particular, that a capacitance of a capacitor of said equalizer is considerably higher than a capacitance at the input of the amplifier. As a result, a resistive element of the equalizer has to be correspondingly smaller than the resistance at the input of the amplifier in order that the equalizer would function properly. Consequently, the realization according to U.S. Pat. No. 4,498,107, in which a common control current is used, often causes problems in practice. The first amplification stage always amplifies the signal component. This leads to another problem because the ac component has been increased at the equalizer diode, whereas the control current has remained unchanged. This further aggravates the nonlinearity problems.

SUMMARY OF THE INVENTION

The drawbacks men above are obviated and a number of further advantages are obtained by means of the method according to the invention, which is applied at an input stage of an optical receiver. The input stage comprises a PIN or an APD photodiode acting as a detector, and a transimpedance or a high-impedance amplifier a input of which is connected to one terminal of the photodiode. The method according to the invention comprises the steps of detecting an optical signal by means of the photodiode for generating a signal current having a dc component and an ac component; attenuating the ac component of the detected signal current by means of a first semiconductor diode means connected to the point of connection of the photodiode and the input of the amplifier by adjusting the dynamic resistance of the semiconductor diode means by a first direct current which is proportional to the signal current and the value of which is e.g. at least two times greater than the peak value of the ac component of the detected signal current. The dynamic resistance r of the diode is inversely proportional to a current I passing through the diode, as appears from FIG. 2. The basic idea of the invention is that the diode is made to operate within the linear range by giving the direct current $I_1$ a sufficiently high value as compared to the ac component. In place of an RF-PIN diode, it is thereby possible to choose any semiconductor diode which has a small-value leakage current in the reverse direction and a low capacitance. This is of importance because the capacitance of commercially available RF-PIN diodes having a long carrier lifetime (2000 ns) is many times greater than that of rapid diodes. When using a high-value control current, the attenuation effect is considerably greater than in the prior art applications.

The method further comprises the step of bringing the attenuation diode(s) to a high-impedance state when the level of the optical signal is below a predetermined treshold value. This means that the attenuation diodes are reverse biased at low levels of the optical signal. The diodes have a low capacitance (about 0.05 pF) and a high resistance when reverse biased. This is of advantage in that when the received optical level is low, all the components connected to the detecting connection have to present an impedance as high as possible. This requirement is due to the fact that the photodiode detector is of the current generator type, and the optimal matching is obtained with a high-impedance load.

BRIEF DESCRIPTION OF THE DRAWINGS

According to the method the semiconductor diode means of the RC equalizer is adjusted by means of a second direct current which is proportional to the control current of the first semiconductor diode means. This second control current is scaled in accordance with the capacitor of the RC equalizer so that the time constant of the equalizer becomes as desired. The control current of this equalizer also has to be substantially greater than the ac component of the signal current in order that the diode(s) would not distort the signal.

In the following the method according to the present invention and the preferred embodiments thereof will be described in more detail with reference to the attached drawings wherein.

DETAILED DESCRIPTION OF THE INVENTION

Figure 3:
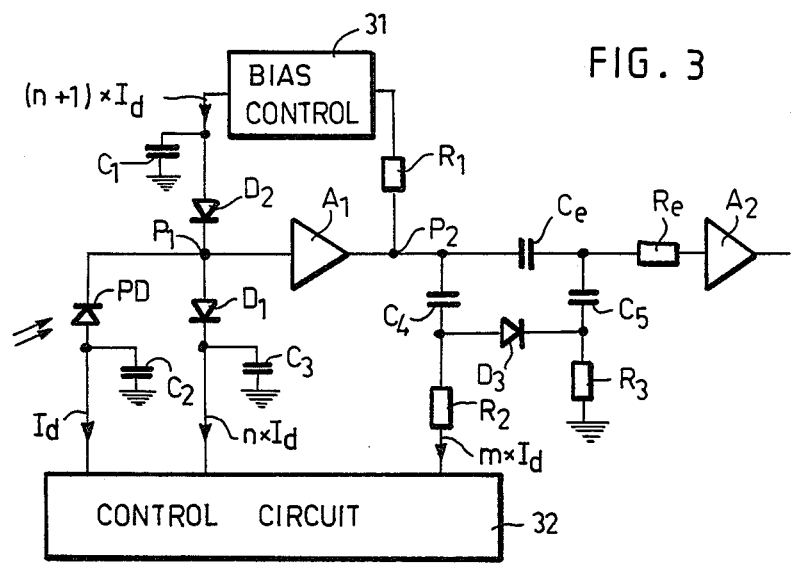
FIG. 3 illustrates an input stage according to the invention in an optical receiver.
Figure 1:
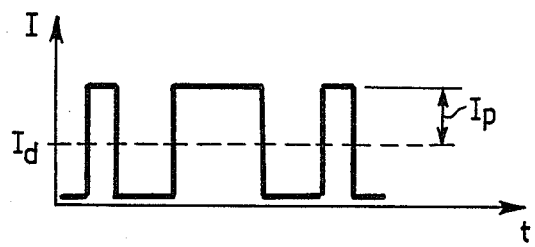
FIG. 1 illustrates a detected signal current.
Figure 2:
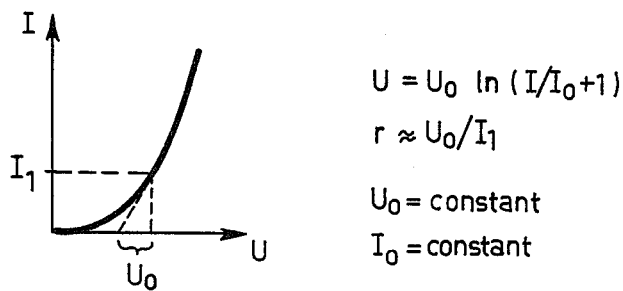
FIG. 2 shows the characteristic curve of a semiconductor diode.

FIG. 3 shows a general circuitry of an input stage according to the invention. The cathode of a reverse biased photodiode PD acting as a detector is connected to the input of a high-impedance amplifier $A_1$. Two semiconductor diodes $D_1$ and $D_2$ are connected to the point of connection of the photodiode PD and the amplifier $A_1$. The cathode of the diode $D_2$ is connected to the input of the amplifier $A_1$, and the anode to a biasing block 31 of the amplifier $A_1$. The anode of the diode $D_1$ is correspondingly connected to the input of the amplifier $A_1$. The anode of the photodiode PD and the cathode of the diode $D_1$ are connected to a control block 32.

A capacitor $C_e$ and a resistor $R_e$ of an RC equalizer are connected in series to the output of the amplifier $A_1$. A control semiconductor diode $D_3$ of the RC equalizer is connected in parallel with the capacitor $C_e$ through capacitors $C_4$ and $C_5$. The anode of the diode $D_3$ is connected to the control block 32 through a resistor $R_2$, and the cathode correspondingly through a resistor $R_3$ to the earth so that the diode $D_3$ is forward biased.

In studying the operation of the circuit, it is first assumed that the detected dc component $I_d$ has exceeded a predetermined threshold value. This threshold value corresponds to an optical power sufficiently above the sensitivity threshold of the receiver. Above the threshold value, the control block 32 effects a forward biasing of the attenuation diodes $D_1$ and $D_2$, and generates currents adjusting the dynamic resistance r of the diodes by multipying the detected dc components $I_d$ by a value n. The current of the photodiode PD also passes through the attenuation diode $D_2$, so that the value of the current passing therethrough will be $(n+1)I_d$. The value of the scaling coefficient n is chosen that it is least so high (e.g. $n \geq 2$) that the diodes $D_1$ and $D_2$ do not distort the ac component of the signal and that the ac component of the signal current occuring at the control diode D3 of the RC equalizer is not at any stage increased close to the value of the control current of the equalizer diode $D_3$. Capacitors $C_1$ and $C_3$ connect the attenuation diodes $D_1$ and $D_2$ to the earth so that they form a load impedance for the ac component of the signal occuring at the point of connection $P_1$, the value of the load impedance varying as a function of the control current so that when the control current increases, the resistance of the load impedance is decreased.

If the scaling coefficient is e.g. 10, the maximum signal level occurring at subsequent amplifier stages and in the equalizer drops 20 dB, and the non-linearity problems disappear.

The time constant of the RC equalizer, positioned between the amplifiers $A_1$ and $A_2$ and formed by the resistors $R_e$, the capacitor $C_e$ and the equalizer diode $D_3$, has to be maintained at the same value as the time constant of an RC circuit formed by the resistances and and stray capacitances occuring at the point of connection $P_1$. This is carried out by adjusting the dynamic resistance of an equalizer diode $D_3$ by means of a second control current $m \times I_d$ generated by the control block 32 and proportional to the first control current $n \times I_d$. The scaling coefficient m is chosen on the basis of the equalizer capacitance $C_e$ in such a manner that the above-mentioned time constant condition is fulfilled. The value of the equalizer capacitance $C_e$ is preferably chosen so that the impedance thereof at the upper limits of the frequency range to be equalized is in the same range as the value of the equalizer resistors $R_e$. Accordingly, the value of the equalizer capacitance $C_e$ and the value of the scaling coefficient m are different at different transmission speeds. By virtue of the scaling coefficient m, the values of the equalizer components $C_e$ and $R_e$ can be chosen freely for the achievement of an optimal signal-to-noise ratio and optimal dynamic properties.

When the received optical level is below a predetermined threshold value, the diodes $D_1$ and $D_2$ are reverse biased by the control block 32 and the biasing circuit 31. The detecting point $P_1$ thereby presents a very high impedance, and the sensitivity of the input stage is optimized.

The biasing block 1 shown in FIG. 3 illustrates generally the biasing of the amplifier $A_1$ when the control block is in operation, and it can be carried out in practice in various ways obvious to one skilled in the art. In the case of FIG. 3, the biasing block 31 supplies biasing voltages to the diode $D_2$.

The control block 32 of FIG. 3 illustrates generally the circuitry and circuits necessary for generating the control currents and biasing voltages of the diodes. Therefore the biasing block 31, e.g., could be included in the control block. The control block 32 can be realized in many different ways without deviating from the inventive idea.

The attenuation of an optical fibre transmission link is steady, so the control does not need to respond promptly to variations in the dc component $I_d$. Consequently, the time constant maintaining the control currents of the control block 32 can be given such a high value that the control does not substantially respond to variations of the dc component $I_d$ caused by an unbalanced and uncoded signal and long "0" and "1" sequences.

When the used amplifier $A_1$ is a transimpedance amplifier, the equalizer $C_e$- $R_e$- $D_3$ is not necessary if the bandwidth of the amplifier $A_1$ remains unchanged in spite of the attenuation caused by the diodes $D_1$ and $D_2$. Thereby the control block 32 does not, either, need to generate the control current of the RC equalizer.

Figure 4:
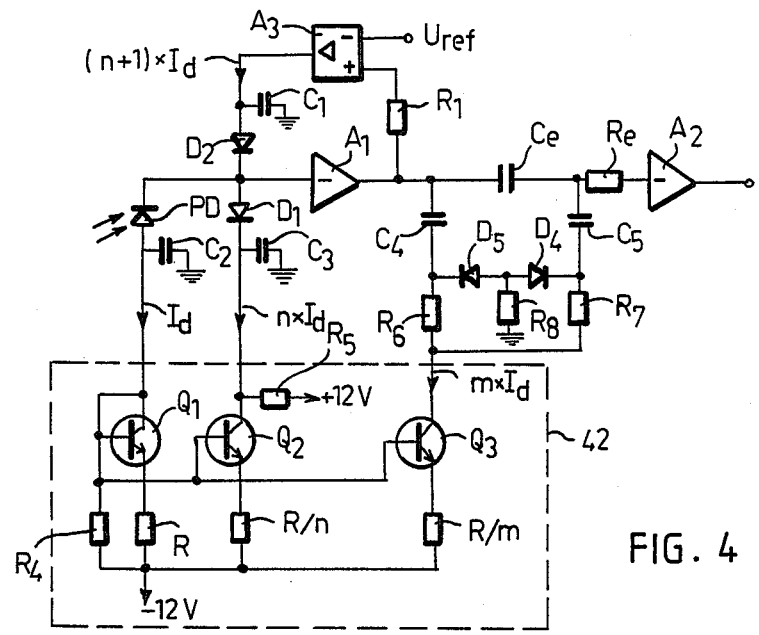
FIG. 4 illustrates a preferred embodiment of the invention when the amplifier is of the high-impedance type.

FIG. 4 illustrates a preferred embodiment of the invention when a high-impedance amplifier $A_1$ is used. The equalizer diode $D_3$ of FIG. 3 is herein replaced by two equalizer semiconductor diodes $D_4$ and $D_5$ the anodes of which are connected together and through a resistor $R_8$ to the earth. The cathode of the diode $D_4$ is connected through a resistor $R_7$ and the cathode of the diode $D_5$ respectively through a resistor $R_6$ to one and the same point at a control block 42. Capacitors $C_4$ and $C_5$ connect the cathodes of the diodes $D_4$ and $D_5$ to the terminals of an equalizer capacitor $C_e$. The equalizer diodes $D_4$ and $D_5$ are thereby in series in view of the ac component of the signal current and in parallel in view of the control current. In order that the series-connected resistance of the equalizer diodes $D_4$ and $D_5$ would equal to the resistance of the equalizer diode of FIG. 3, the control current passing through the diodes has to be double, and the total current $m \times I_d$ fourfold as compared to the case of FIG. 3. In this way the control current can be maintained substantially larger than the ac component, and the non-linearity problems are avoided even more efficiently. If necessary, the number of the series-connected equalizing diodes can be further increased. As compared to the case of one diode, the control current passing through each diode has to be multiplied by a coefficient equalling to the number of the diodes in order that the same total resistance could be obtained. For example, if the diode $D_3$ is replaced by two diodes, and the diode $D_4$ respectively with two diodes, the series connection includes four diodes, and the control current is fourfold, while the ac component of the signal current is maintained at a constant value.

The control block 42 shown in FIG. 4 (which block carries out the same operations as the block 32 of FIG. 3) comprises a current mirror coupling formed by transistors $Q_1$, $Q_2$ and $Q_3$. The collector and the base of the transistor $Q_1$ are connected to the anode of the photodiode PD and through a resistor $R_4$ to an operating voltage $-12$ V. The base of the transistor $Q_1$ is further connected to the base of the transistors $Q_2$ and $Q_3$. The resistor $R_4$ determines the threshold value at which the scaling of the control currents is started. When the current $I_d$ is below the threshold value, the transistors $Q_1$, $Q_2$ and $Q_3$ are closed, and the current $I_d$ is wholly passed through the resistor $R_4$. The attenuation diode $D_1$ is thereby reverse biased by means of a $+12$ V voltage obtained through a resistor $R_5$. Correspondingly, the attenuation diode $D_2$ is reverse biased by biasing circuit $A_3$.

The control process itself is started when the voltage generated by the current $I_d$ across the resistor $R_4$ is sufficient to cause the transistors $Q_1$, $Q_2$ and $Q_3$ to conduct. Thereby the diodes $D_1$, $D_2$ and $D_4$ and $D_5$ too, are forward biased. The currents passing through the transistors are determined by the ratios of their emitter resistances $R$, $R/n$ and $R/m$ so that a smaller emitter resistance generates a larger current. In FIG. 4, the current $I_d$ passes through the transistor $Q_1$, the current $n \times I_d$ through the transistor $Q_2$, and the current $m \times I_d$ through the transistor $Q_3$. The scaling coefficients $n,m$ are chosen as described above.

Figure 5:
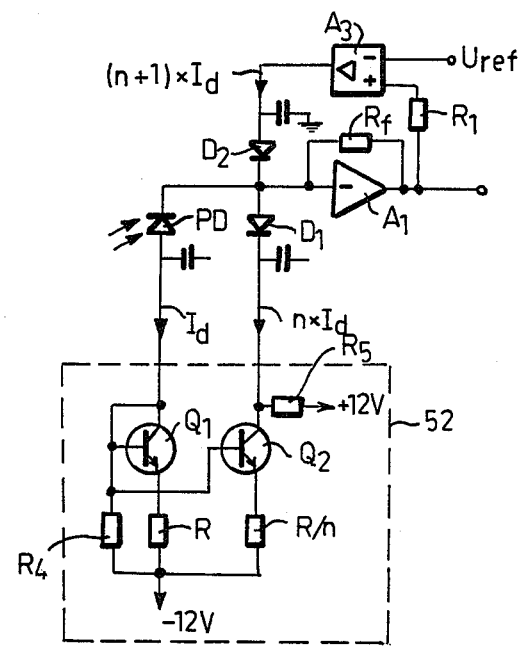
FIG. 5 illustrates a preferred embodiment of the invention when the amplifier is of the transimpedance type.

FIG. 5 shows a corresponding circuitry for a transimpedance amplifier $A_1$. As distinct from FIG. 4, the amplifier $A_1$ comprises a feedback resistor $R_f$, and the equalizer and the transistor corresponding thereto are omitted. The operation of the circuitry substantially corresponds to the operation of the circuit of FIG. 4.

FIGS. 6a to 6d illustrate alternative arrangements which, according to the invention, attenuate a signal at the point of connection $P_1$ of the photodiode PD and the amplifier $A_1$. If the amplifier requires an RC equalizer to be provided at the output thereof, e.g. the equalizers described above can be used.

Figure 6A:
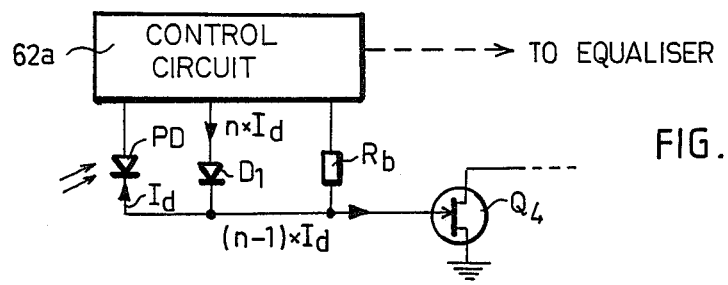
FIGS. 6a to 6e illustrate different arrangements according to the invention for the attenuation of the ac component of the signal current at the point of connection of a photodiode and an amplifier.

In FIG. 6a, the amplifier is a field effect transistor $Q_4$ the gate of which is connected to the cathode of the photodiode PD. The coupling is peculiar in that a gate Schottky diode of the field effect transistor $Q_4$ (GaAsFET) acts as a second attenuation diode, which arrangement decreases the number of the components included in the detecting point $P_1$, thus reducing the stray capacitance of said point.

A block 62a provides the biasing voltages of the photodiode PD and the diode $D_1$. At low levels of the optical signal, the diode $D_1$ is reverse biased. The gate Schottky diode is also reverse biased by means of an 0 V or a negative voltage applied to the gate. After a determined threshold value is exceeded, the diode $D_1$ and the gate Schottky diode are caused to conduct, and the control block 62a supplies direct currents $n \times I_d$ and $(n-1)I_d$ which adjust the dynamic resistance of the diode $D_1$ and the gate Schottky diode, so that said diodes act as adjustable attenuators.

The biasing of the field effect transistor $Q_4$ (through a resistor $R_b$) has to be able to compensate an increase in a drain current due to a positive gate voltage. If the FET comprises two gates, the compensating can be carried out by means of the extra gate.

Figure 6B:
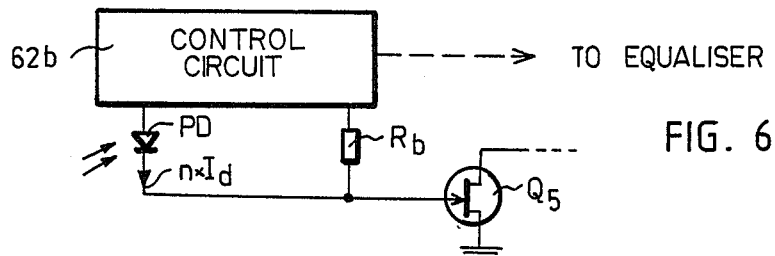

The only difference between FIGS. 6a and 6b is that in FIG. 6b the diode $D_1$ is omitted and the photodiode PD is used in place thereof as an attenuation diode. The second attenuation diode is still formed by the gate Schottky diode of the field effect transistor $Q_4$. A block 62b supplies a control current $n \times I_d$ through the photodiode PD and the gate Schottky diode which are biased in the forward direction, so that the dynamic resistance of the photodiode and the gate Schottky diode varies as a function of the control current. Information on the level of the received signal is obtained e.g. from an AGC circuit of the receiver. At low levels of the optical signal the photodiode PD and the gate Schottky diode may be reverse biased by the block 62b. This maximizes the sensitivity and minimizes the stray capacitances. A major advantage of the circuitry shown in FIG. 6a is that besides the photodiode PD and the FET $Q_4$, no other components are needed at the capacitance-sensitive detecting connection $P_1$. The resistor $R_b$ is the biasing resistor of the FET $Q_4$.

The blocks 62a and 62b generally represent a circuitry which produces the required voltages and control currents, and they correspond e.g. to the blocks 1 and 2 of FIG. 3. If the amplifier $A_1$ requires an RC equalizer, the blocks 62a and 62b can generate a control current for the RC equalizer, too.

Figure 6C:
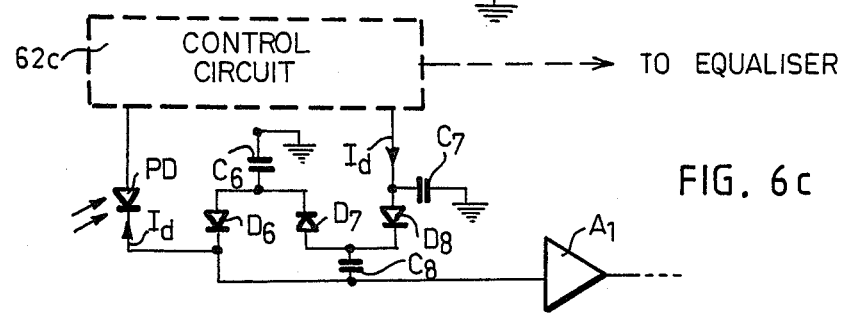

FIG. 6c illustrates an arrangement by means of which it is very easy to carry out the basic idea of the invention, i.e. that a direct current adjusting the dynamic resistance of the semiconductor diodes has to be substantially greater than a peak value of the ac component of the signal current.

Three diodes $D_6$, $D_7$ and $D_8$ are connected in series at the connection point $P_1$ of the photodiode PD and the amplifier $A_1$ in such a manner that the cathode of the diode $D_6$ is connected to the cathode of the photodiode PD, the cathode of the diode $D_7$ is connected to the anode of the diode $D_6$ and the cathode of the diode $D_8$ is connected to the anode of the diode $D_7$. The anodes of the diodes $D_6$ and $D_8$ are connected to the earth through capacitors $C_6$ and $C_7$. Correspondingly, the anode of the diode $D_7$ is connected through a capacitor $C_8$ to the point of connection $P_1$. Accordingly, the diodes $D_6$ to $D_8$ are connected in series in view of the direct current $I_d$ and in parallel in view of the ac component. When the diodes $D_6$ to $D_8$ are forward biased, and the photodiode PD is reverse biased, an optical signal received at the photodiode PD produces a dc component $I_d$ which is passed through the diodes $D_6$ to $D_8$, thereby adjusting a dynamic resistance r for each diode. Since the diodes $D_6$ to $D_8$ are connected in parallel in view of the ac component, the resistances thereof are also in parallel, and the total resistance in view of ac component will be r/3. Consequently, the ac component of the signal current is attenuated so that it is one third of the dc component $I_d$. A block 62c represents generally a circuitry which generates the required voltages. If the amplifier $A_1$ requires an RC equalizer to be provided at the output thereof, the block 62c can produce a control current for the equalizer diode as well.

Figure 6D:
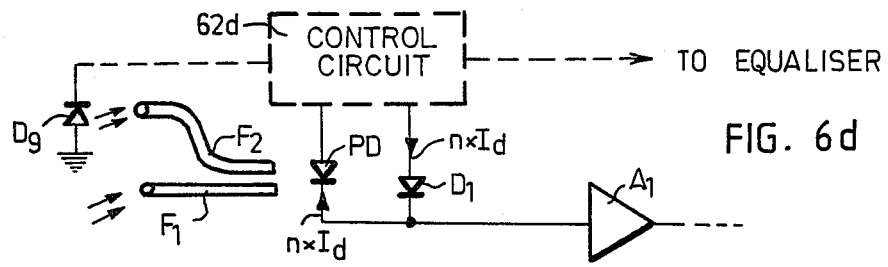

FIG. 6d illustrates a circuitry in which the cathode of a forward biased attenuation diode $D_1$ is connected to a point of connection between the cathode of a reverse direction photodiode PD and an amplifier $A_1$. The optical signal itself is applied to the photodiode PD via an optical fibre $F_1$. The coupling further comprises a LED or a laser diode $D_9$ which emits unmodulated additional light to the photodiode PD e.g. along another optical fibre $F_2$. The detected additional light increases the dc component $I_d$ passing through the diode $D_1$ and detected by the photodiode. If the level of the unmodulated additional light is (n−1) times the average level of the optical signal itself, the control current will be $n \times I_d$. The control signal determining the level of the additional light emitted by diode $D_9$ can be generated e.g. by means of an AGC circuit positioned further in the receiver. A block 62d represents generally the required control circuitry which produces the biasing voltages of the diodes PD and $D_1$, and, if necessary, also a control current for the RC equalizer. At low optical levels, the diode $D_1$ may be reverse biased by block 62d.

Figure 6E:
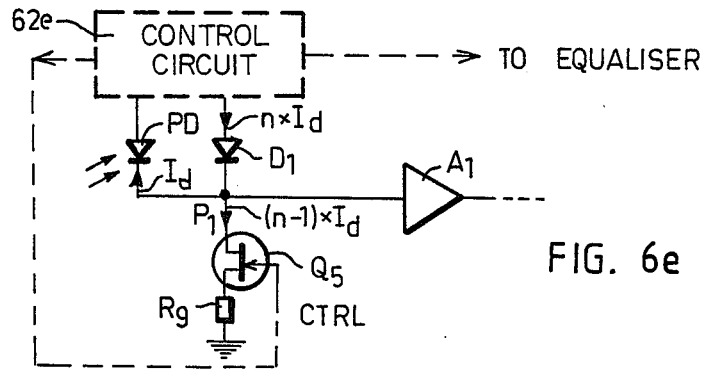

FIG. 6e illustrates an arrangement in which an attenuation diode $D_1$ and a field effect transistor $Q_5$ generating an additional control current $n \times I_d$ for the diode $D_1$ are connected to the point of connection between a photodiode and an amplifier $A_1$. A control signal CTRL applied to the gate of the field effect transistor $Q_5$ is obtained from a block 62e. The block 62e generates the required biasing voltages and possibly a control current for an RC equalizer.

Even though specific embodiments of the present invention have been described above, it is to be understood that various changes and modifications can be made without deviating from the inventive idea and the scope of protection defined in the attached claims. The control currents and the biasing voltages in particular can be generated in many different ways differing from those described above.

What is claimed is:

1. An arrangement for increasing the dynamic range at an input stage of an optical receiver, which input stage comprises a photodiode for detecting an optical signal and for generating a signal current proportional to said optical signal and comprising a dc component and an ac component, and an amplifying means an input of which is connected to one terminal of the photodiode, said arrangement comprising at least two forward biased semiconductor diodes connected to the point of connection between the photodiode and the input of the amplifying means in such a manner that the semiconductor diodes are connected in series with respect to the dc component of the signal current and in parallel with respect to the ac component of the signal current, so that a ratio of a value of the dc component of the signal current to a value of the ac component equals the number of said semiconductor diodes.

2. An arrangement for increasing the dynamic range at an input stage of an optical receiver, which input stage comprises a photodiode for detecting a received optical signal and for generating a signal current proportional to said optical signal and comprising a dc component and an ac component, and an amplifying means an input of which is connected to one terminal of the photodiode, said arrangement comprising:
 two serially connected forward biased semiconductor diodes, the point of connection between said diodes being connected to the point of connection between the amplifying means and the photodiode, for attenuating the ac component of the signal current; and
 a control means responsive to the average value of the signal current for generating a dc control current adjusting a dynamic resistance of said semiconductor diodes, said dc control current passing through said semiconductor diodes and having a value substantially higher than a peak value of the ac component of the signal current in the input of the amplifying means so that the ac component of the signal current is not distorted by the semiconductor diodes.

3. An arrangement according to claim 2, wherein said control means reverse biases said semiconductor diodes to a high-impedance state when the level of the optical signal is below a predetermined threshold level, and adjusts the dynamic resistance of said semiconductor diodes when the level of the optical signal is above the predetermined threshold level.

* * * * *